US012802758B2

(12) United States Patent
Liu et al.

(10) Patent No.: US 12,802,758 B2
(45) Date of Patent: Nov. 17, 2026

(54) MEMORY DEVICES, SYSTEMS, AND METHODS FOR FORMING THE SAME

(71) Applicant: YANGTZE MEMORY TECHNOLOGIES CO., LTD., Wuhan (CN)

(72) Inventors: Bo Liu, Wuhan (CN); Lei Liu, Wuhan (CN); Yuancheng Yang, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 345 days.

(21) Appl. No.: 18/671,388

(22) Filed: May 22, 2024

(65) Prior Publication Data

US 2025/0356919 A1 Nov. 20, 2025

(30) Foreign Application Priority Data

May 16, 2024 (CN) ......................... 202410612400.1

(51) Int. Cl.

| | |
|---|---|
| ***H10B 41/27*** | (2023.01) |
| ***G11C 16/04*** | (2006.01) |
| ***H10B 41/20*** | (2023.01) |
| ***H10B 41/35*** | (2023.01) |
| ***H10B 43/20*** | (2023.01) |
| ***H10B 43/27*** | (2023.01) |
| ***H10B 43/35*** | (2023.01) |
| ***H10B 80/00*** | (2023.01) |

(52) U.S. Cl.
CPC ......... *G11C 16/0483* (2013.01); *H10B 41/20* (2023.02); *H10B 41/27* (2023.02); *H10B 41/35* (2023.02); *H10B 43/20* (2023.02); *H10B 43/27* (2023.02); *H10B 43/35* (2023.02); *H10B 80/00* (2023.02)

(58) Field of Classification Search
CPC .... G11C 16/0483; H10B 41/27; H10B 41/35; H10B 43/27; H10B 41/20; H10B 43/20; H10B 43/35; H10B 80/00
See application file for complete search history.

(56) References Cited

U.S. PATENT DOCUMENTS

2014/0138687 A1* 5/2014 Lee ........................ H10B 41/27 438/269
2021/0358944 A1* 11/2021 Lee ........................ H10B 43/27
2024/0130130 A1* 4/2024 Liu ........................ H10B 43/27

* cited by examiner

*Primary Examiner* — David Vu
*Assistant Examiner* — Brandon C Fox
(74) *Attorney, Agent, or Firm* — BAYES PLLC

(57) ABSTRACT

A memory device includes a stack structure including interleaved conductive layers and dielectric layers extending in a first direction, a semiconductor layer including a first semiconductor layer in contact with the stack structure and a second semiconductor layer on the first semiconductor layer, and a channel structure extending in the stack structure along a second direction, and in contact with the first semiconductor layer. The semiconductor layer includes a first semiconductor portion extending along the first direction and a second semiconductor portion extending into the channel structure along the second direction.

20 Claims, 15 Drawing Sheets

400

200

400

400

400

400

400

400

400

MEMORY DEVICES, SYSTEMS, AND METHODS FOR FORMING THE SAME

CROSS-REFERENCE TO RELATED APPLICATIONS

This application claims the benefit of priority to Chinese Application No. 202410612400.1, filed on May 16, 2024, which is incorporated herein by reference in its entirety.

BACKGROUND

The present disclosure relates to semiconductor technology, and more particularly, to semiconductor devices and the method of forming semiconductor devices.

Planar memory cells are scaled to smaller sizes by improving process technology, circuit design, programming algorithm, and fabrication process. However, as feature sizes of the memory cells approach a lower limit, planar process, and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

Implementations of memory devices and methods for forming the same are disclosed herein.

In one aspect, a memory device is disclosed. The memory device includes a stack structure including interleaved conductive layers and dielectric layers extending in a first direction, a semiconductor layer including a first semiconductor layer in contact with the stack structure and a second semiconductor layer on the first semiconductor layer, and a channel structure extending in the stack structure along a second direction perpendicular to the first direction, and in contact with the first semiconductor layer. The semiconductor layer includes a first semiconductor portion extending along the first direction and a second semiconductor portion extending into the channel structure along the second direction.

In some implementations, the conductive layers include at least one source select gate line, and the second semiconductor portion overlaps the at least one source select gate line in the first direction.

In some implementations, the channel structure includes a blocking layer, a storage layer, a tunneling layer, a semiconductor channel layer, and a capping layer stacking along the first direction, and the second semiconductor portion is surrounded by at least the blocking layer, the storage layer, and the tunneling layer.

In some implementations, the first semiconductor layer is in contact with the semiconductor channel layer and the capping layer.

In some implementations, the channel structure further includes a core layer filled in the capping layer, and the first semiconductor layer and the core layer comprise a same material and are formed in a same process.

In some implementations, the second semiconductor portion, the blocking layer, the storage layer, the tunneling layer, and the at least one source select gate line overlap in the first direction.

In some implementations, the second semiconductor layer has a first doping concentration at a first end of the second semiconductor portion and a second doping concentration at a second end of the second semiconductor portion opposite to the first end in the second direction, and a ratio of the first doping concentration and the second doping concentration is less than 10.

In some implementations, the first semiconductor layer has a doping concentration less than $1\times10^{18}$ atom/$cm^3$, and the second semiconductor layer has a doping concentration between $1\times10^{19}$ and $1\times10^{23}$ atom/$cm^3$.

In some implementations, the semiconductor layer is configured to generate gate-induced-drain-leakage (GIDL)-assisted body bias when performing an erase operation.

In another aspect, a method of manufacturing a semiconductor device is disclosed. A stack structure including interleaved conductive layers and dielectric layers is formed extending in a first direction on a substrate. A channel structure is formed extending in the stack structure along a second direction perpendicular to the first direction. The channel structure includes a blocking layer, a storage layer, a tunneling layer, a semiconductor channel layer, and a capping layer stacking along the first direction. The substrate is removed. A portion of the channel structure is removed to form a recess extending in the second direction in the channel structure. A semiconductor layer including a first semiconductor portion extending along the first direction on the stack structure and a second semiconductor portion extending along the second direction in the recess are formed. A first end of the second semiconductor portion has a first doping concentration, and a second end of the second semiconductor portion opposite to the first end in the second direction has a second doping concentration, and a ratio of the first doping concentration and the second doping concentration is less than 10.

In some implementations, the blocking layer, the storage layer, and the tunneling layer are removed. The semiconductor channel layer and the capping layer are removed, and the channel structure is coplanar with the stack structure. A portion of the capping layer is removed to form the recess extending in the second direction in the channel structure.

In some implementations, a first semiconductor layer is formed in the recess in contact with the semiconductor channel layer and the capping layer and on a surface of the stack structure. A second semiconductor layer is formed on the first semiconductor layer.

In some implementations, the first semiconductor layer has a doping concentration less than $1\times10^{18}$ atom/$cm^3$, and the second semiconductor layer has a doping concentration between $1\times10^{19}$ and $1\times10^{23}$ atom/$cm^3$.

In some implementations, the first semiconductor layer and the second semiconductor layer have different doping concentrations, and a doping concentration of the second semiconductor layer is higher than a doping concentration of the first semiconductor layer.

In some implementations, an activation operation is performed on the second semiconductor layer.

In some implementations, a core layer is formed filled in the capping layer, and the first semiconductor layer and the core layer include a same material and are formed in a same process.

In some implementations, a cap dielectric layer is formed on the second semiconductor layer, and a pad-out layer is formed on the cap dielectric layer.

In some implementations, the semiconductor layer is formed in the recess surrounded by the blocking layer, the storage layer, and the tunneling layer.

In some implementations, the semiconductor layer is formed in the recess overlapping the at least one source select gate line in the first direction.

In some implementations, the substrate is removed from the stack structure, and a sacrificial layer of the stack structure is removed.

In a further aspect, a system is disclosed. The system includes a memory device and a memory controller.

The memory device includes a stack structure including interleaved conductive layers and dielectric layers extending in a first direction, a semiconductor layer including a first semiconductor layer in contact with the stack structure and a second semiconductor layer on the first semiconductor layer, and a channel structure extending in the stack structure along a second direction perpendicular to the first direction, and in contact with the first semiconductor layer. The semiconductor layer includes a first semiconductor portion extending along the first direction and a second semiconductor portion extending into the channel structure along the second direction. The memory controller is coupled to the memory device and configured to control operations of the channel structure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
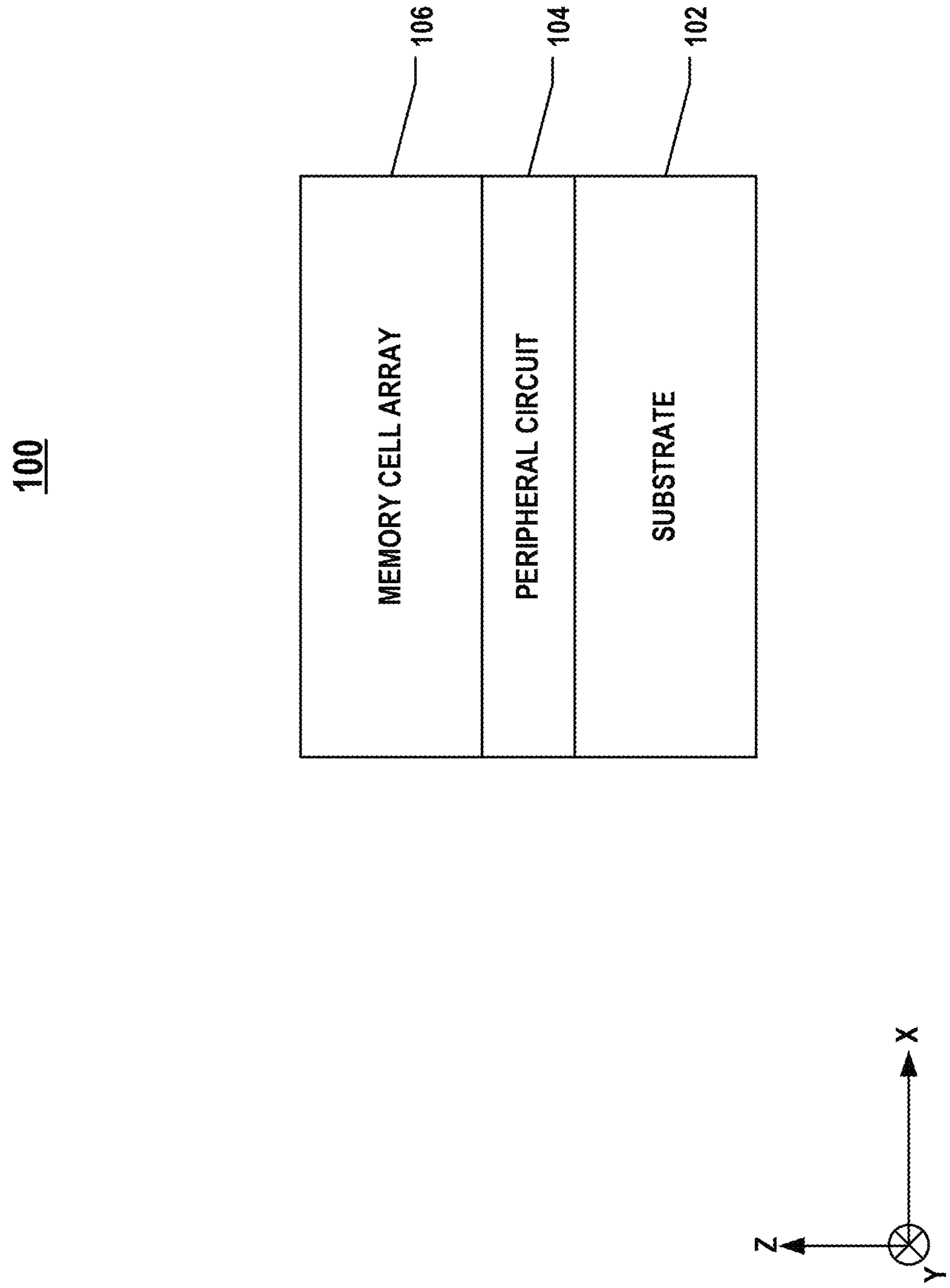
FIG. 1 illustrates a schematic view of a cross-section of a memory device, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

As the demand for higher storage continues to increase, 3D NAND memory devices with an increased number of levels (e.g., memory layers) are employed. Memory strings are formed, extending through the memory layers, creating arrays of memory cells. To perform an erase operation on the memory cells, holes are commonly injected into the semiconductor channels of the memory strings to sustain a positive potential in the memory strings. The holes can be generated from P-wells under the memory strings. However, the increased number of levels in 3D NAND memory devices makes it more difficult to timely and effectively transport the holes from the bottom to the top of the semiconductor channel. As a result, fluctuation can occur in the erase operation, and some memory cells are not effectively erased. As a remedy, gate-induce-drain-leakage (GIDL)-assisted body biasing for erase operation (or GIDL erase operation) has been used to improve the erase efficiency and effectiveness. In a typical GIDL erase operation, the bit line and/or source line electrically connected to a memory string are each applied with a high positive voltage so that holes are generated and injected from the ends, e.g., from beyond a drain-select gate (DSG) and/or a source-select gate (SSG), of the memory string into the semiconductor channel. However, the doped layer of the plug structure, e.g., the n+ poly plug, above or under the word lines needs a deeper implantation depth, and the holes generated in the erase operation are limited to the thickness of the n+ poly plug.

To address the aforementioned issues, the present disclosure introduces a plug structure and an erase operation scheme for memory devices, in particular, 3D NAND memory devices, with improved erase efficiency and effectiveness. By forming an undoped poly layer between the poly plug and the channel poly, the injection direction of the band-to-band-tunneling (BTBT) current in the erase operation could include not only the vertical direction but also the lateral direction that could have more holes generated. In addition, an activation operation, e.g., a laser activation operation, is performed to activate the n+ poly plug that could further prevent doping the undoped poly layer. The erase efficiency of the 3D NAND memory device can be improved.

FIG. 1 illustrates a schematic view of a cross-section of a 3D memory device 100, according to some aspects of the present disclosure. 3D memory device 100 represents an example of a periphery under cell (PUC) structure. In some implementations, a peripheral circuit 104 may be first formed on a substrate 102, and a memory cell array 106 may then be formed on peripheral circuit 104. In some implementations, peripheral circuit 104 may be formed over substrate 102, and a semiconductor layer, e.g., a polysilicon layer, may be formed over peripheral circuit 104. Memory cell array 106 may be formed over the semiconductor layer.

It is noted that the structure in FIG. 1 is for illustration purposes only, and other structures, such as the periphery on cell, multiple layer stacking, or no substrate structures could also be applied to the present application. It is also noted that X-, Y-, and Z-axes are added in FIG. 1 to further illustrate the spatial relationships of the components of a semiconductor device. Substrate 102 of 3D memory device 100 includes two lateral surfaces (e.g., a top surface and a bottom surface) extending laterally in the X-direction and/or the Y-direction (the lateral direction and/or width direction). As used herein, whether one component (e.g., a layer or a device) is "on," "above," or "below" another component (e.g., a layer or a device) of a semiconductor device is determined relative to substrate 102 of 3D memory device 100 in the Z-direction (the vertical direction or thickness direction). The same notion for describing the spatial relationships is applied throughout the present disclosure.

In some implementations, memory cell array 106 includes an array of NAND Flash memory cells. For ease of description, a NAND Flash memory cell array may be used as an example for describing memory cell array 106 in the present disclosure. But it is understood that memory cell array 106 is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

Memory cell array 106 may be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. Memory cell array 106 may include one or more memory planes, and the peripheral circuits that are needed to perform all the read/program (write)/erase operations can be included in peripheral circuit 104.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (e.g., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

As shown in FIG. 1, 3D memory device 100 may include peripheral circuit 104 of memory cell array 106. Peripheral circuit 104 (a.k.a. control and sensing circuits) can include any suitable digital, analog, and/or mixed-signal circuits used for facilitating the operations of memory cell array 106. For example, peripheral circuit 104 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). Peripheral circuit 104 may use CMOS technology, which can be implemented with logic processes in any suitable technology nodes.

Figure 2:
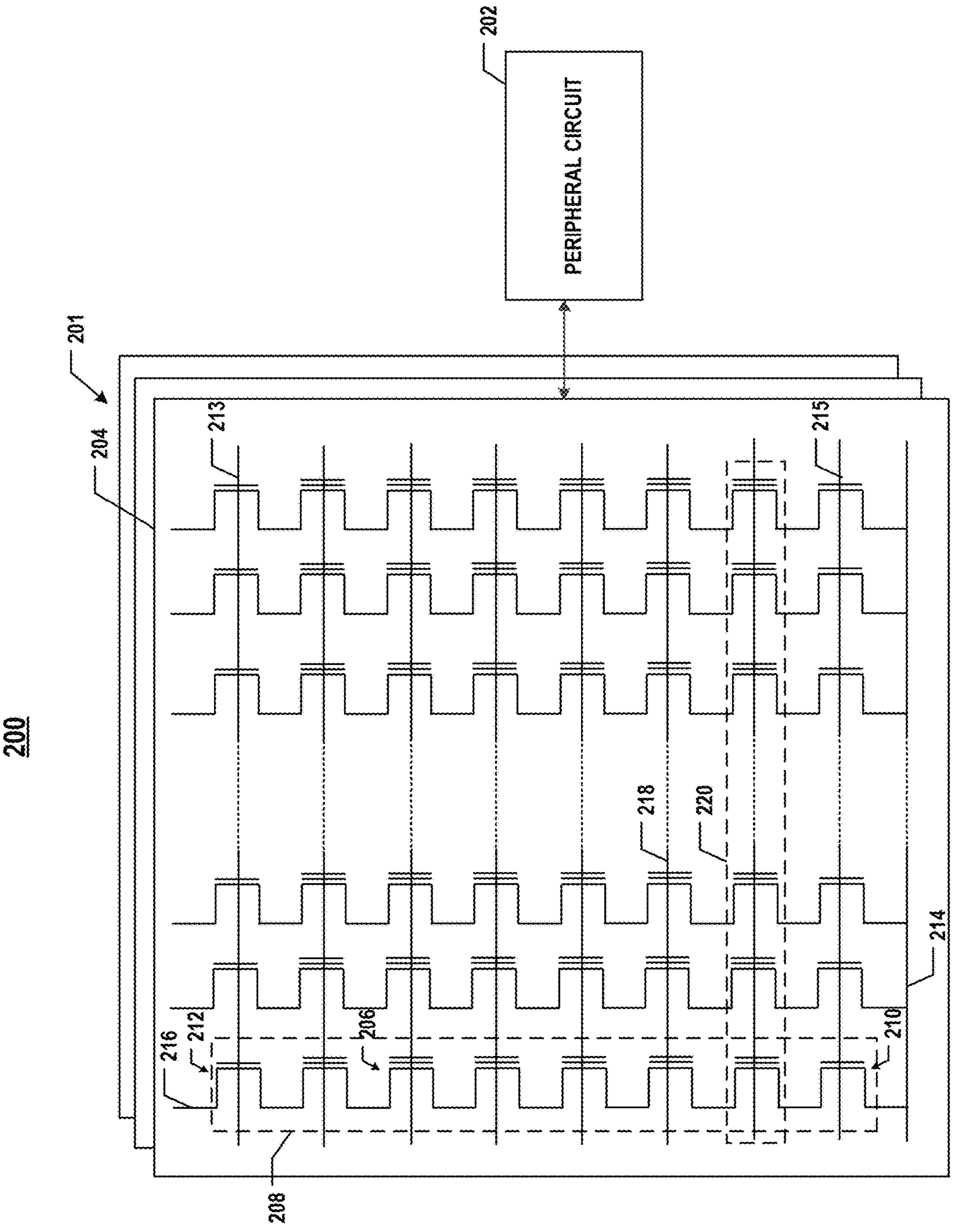
FIG. 2 illustrates a schematic circuit diagram of a memory device including peripheral circuits, according to some implementations of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. 3D memory device 100 may be examples of memory device 200 in which memory cell array 201 and at least peripheral circuits 202 may be included in peripheral circuit 104.

Memory cell array 201 can be a NAND Flash memory cell array in which memory cells 206 are provided in the form of an array of NAND memory strings 208 each extending vertically above a substrate (not shown in FIG. 2). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, e.g., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 3:
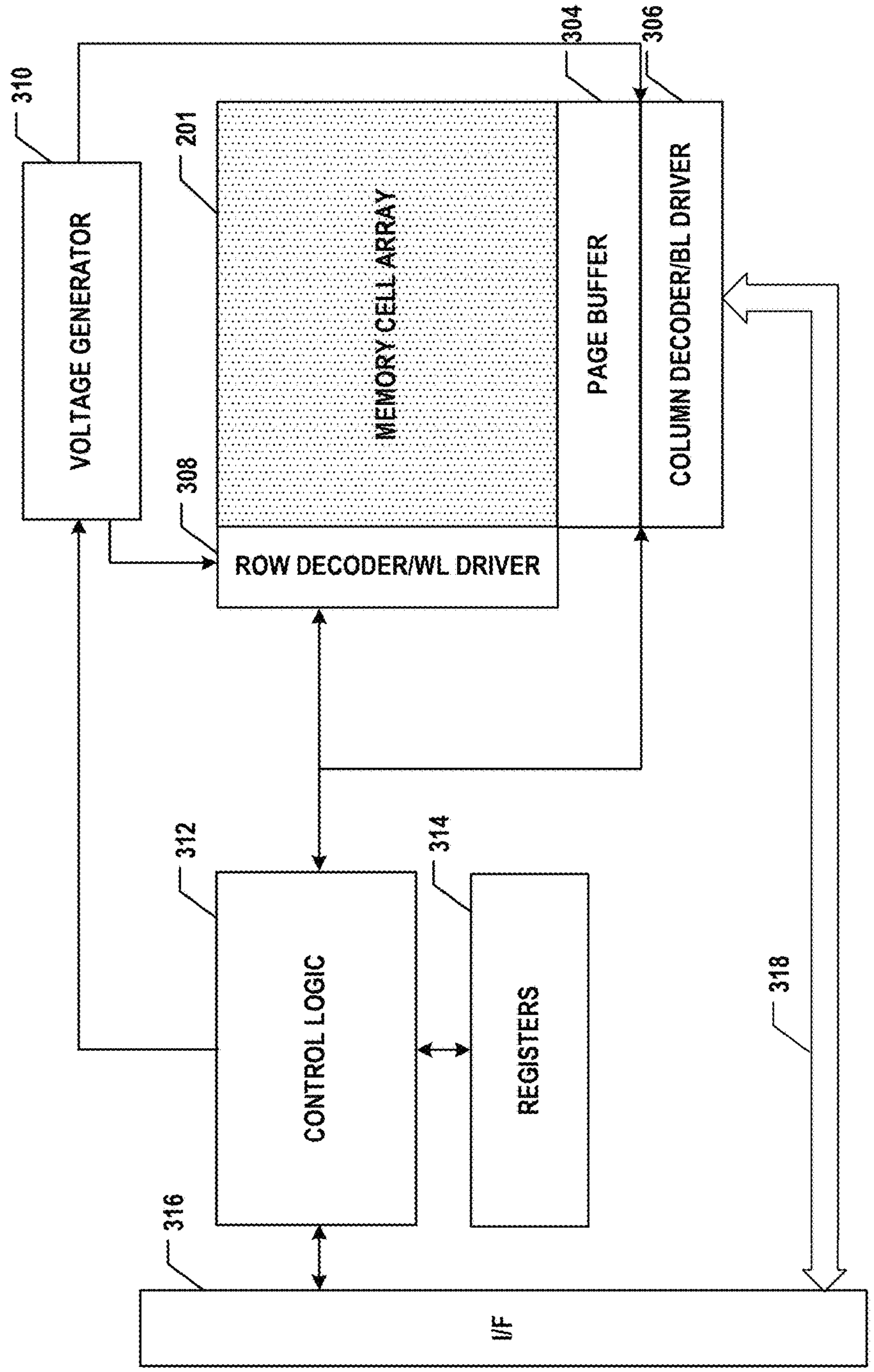
FIG. 3 illustrates a block diagram of a memory device including a memory cell array and peripheral circuits, according to some implementations of the present disclosure.

Peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using CMOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to buffer data read from or programmed to memory cell array 201 according to the control signals of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select block 204 of memory cell array 201 and a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310.

Column decoder/bit line driver 306 can be configured to be controlled by control logic 312 and select one or more 3D NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202.

Interface 316 can be coupled to control logic 312 and configured to interface memory cell array 201 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are parts of an I/O circuit of peripheral circuits 202.

Voltage generator 310 can be configured to be controlled by control logic 312 and generate the word line voltages (e.g., read voltage, program voltage, pass voltage, local voltage, and verification voltage) and the bit line voltages to be supplied to memory cell array 201. In some implementations, voltage generator 310 is part of a voltage source that provides voltages at various levels of different peripheral circuits 202 as described below in detail. Consistent with the scope of the present disclosure, in some implementations, the voltages provided by voltage generator 310, for example, to row decoder/word line driver 308, column decoder/bit line driver 306, and page buffer 304 are above certain levels that are sufficient to perform the memory operations. For example, the voltages provided to the page buffer circuits in page buffer 304 and/or the logic circuits in control logic 312 may be between 1.3 V and 5 V, such as 3.3 V, and the voltages provided to the driving circuits in row decoder/word line driver 308 and/or column decoder/bit line driver 306 may be between 5 V and 30 V.

Figure 4:
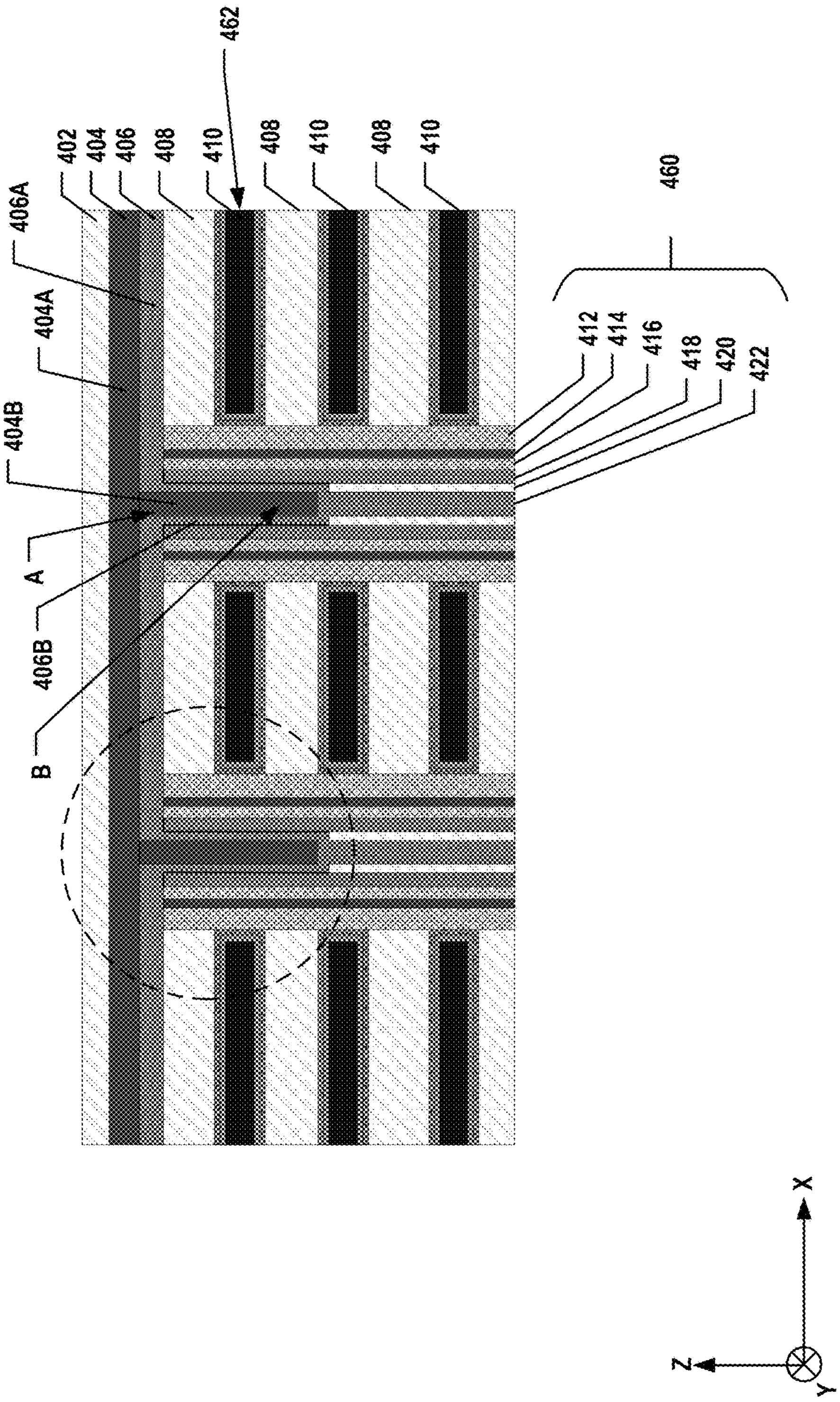
FIG. 4 illustrates a cross-sectional view of an exemplary memory device, according to some implementations of the present disclosure.

FIG. 4 illustrates a cross-sectional view of an exemplary memory device 400, according to some implementations of the present disclosure. As shown in FIG. 4, memory device 400 includes a stack structure including interleaved conductive layers 410 and dielectric layers 408 extending in the X-direction. In some implementations, conductive layers 410 may be the word lines, and dielectric layer 408 may be the silicon oxide layers. In some implementations, conductive layer 410 may be a gate structure including a gate dielectric layer and a gate conductive layer on gate dielectric layer. In some implementations, the gate dielectric layer may include any suitable dielectric materials, such as silicon oxide, silicon nitride, silicon oxynitride, or high-k dielectrics. In some implementations, the gate dielectric layer includes silicon oxide, which is a form of a gate oxide. The gate conductive layer may include any suitable conductive materials, such as polysilicon, metals (e.g., W, Cu, Al, etc.), metal compounds (e.g., TiN, TaN, etc.), or silicides. In some implementations, the gate conductive layer may include doped polysilicon, which is a form of a gate poly.

As shown in FIG. 4, memory device 400 further includes a semiconductor layer including a first semiconductor layer 406 in contact with the stack structure and a second semiconductor layer 404 on first semiconductor layer 406. In some implementations, a dielectric layer 402 is formed on second semiconductor layer 404. In some implementations, first semiconductor layer 406 is an undoped polysilicon layer, second semiconductor layer 404 is an n+ doping polysilicon layer, and dielectric layer 402 is a silicon oxide layer. A channel structure 460 is formed in memory device 400 extending in the stack structure along the Z-direction perpendicular to the X-direction. In some implementations, channel structure 460 is in contact with first semiconductor layer 406.

The semiconductor layer includes a first semiconductor portion, including a first portion 406A of first semiconductor layer 406 and a first portion 404A of second semiconductor layer 404, extending along the X-direction. The semiconductor layer further includes a second semiconductor portion, including a second portion 406B of first semiconductor layer 406 and a second portion 404B of second semiconductor layer 404, extending along the Z-direction. In some implementations, second portion 404B of second semiconductor layer 404 has a first doping concentration at a first end A of second portion 404B of second semiconductor layer 404 and a second doping concentration at a second end B of second portion 404B of second semiconductor layer 404 opposite to the first end A in the Z-direction. In some implementations, a ratio of the first doping concentration at first end A and the second doping concentration at second end B is less than 20. In other words, the n+ doping concentration at first end A is less than 20 times of the n+ doping concentration at second end B. In some implementations, a ratio of the first doping concentration at first end A and the second doping concentration at second end B is less than 10. In other words, the n+ doping concentration at first end A is less than 10 times of the n+ doping concentration at second end B. In some implementations, a ratio of the first doping concentration at first end A and the second doping concentration at second end B is less than 5. In other words, the n+ doping concentration at first end A is less than 5 times of the n+ doping concentration at second end B.

In some implementations, the topmost layer, or the bottommost layer, of conductive layers 410 is formed as a source select gate line 462, as shown in FIG. 4. In some implementations, multiple topmost layers, or multiple bottommost layers, of conductive layers 410 are formed as source select gate lines 462. It is noted that the number of layers of source select gate lines 462 is not limited in the present application. In the present application, the number of layers of source select gate lines 462 is at least greater than 1. As shown in FIG. 4, second portion 406B of first semiconductor layer 406 and second portion 404B of second semiconductor layer 404 are at least overlapped with one layer of source select gate lines 462 in the X-direction.

As shown in FIG. 4, the channel structure 460 includes a blocking layer 412, a storage layer 414, a tunneling layer 416, a semiconductor channel layer 418, and a capping layer 420 stacking along the X-direction. In some implementations, the channel structure includes blocking layer 412, storage layer 414, tunneling layer 416, semiconductor channel layer 418, and capping layer 420 stacking along the radial direction of the channel structure. In some implementations, the channel structure further includes a core layer 422 filled in capping layer 420. In some implementations, blocking layer 412, storage layer 414, and tunneling layer 416 are also named as a memory film. In some implementations, blocking layer 412 may include silicon oxide, silicon oxynitride, high-k dielectric material, or any combination thereof. In some implementations, storage layer 414 may include silicon nitride, silicon oxynitride, silicon, or any combination thereof. In some implementations, tunneling layer 416 may include silicon oxide, silicon oxynitride, or any combination thereof. In some implementations, the memory film may be a composite layer of silicon oxide/silicon nitride/silicon oxide (ONO).

In some implementations, tunneling layer 416 is located between semiconductor channel layer 418 and storage layer 414. Storage layer 414 is also referred to as a charge trapping layer, and the storage or removal of the charge in the charge trapping layer determines the switching state of the semiconductor channel. The charge moves between the storage layer 414 and semiconductor channel layer 418 through the tunneling effect of tunneling layer 416 to realize turning on/off the semiconductor channel layer 418, and then realizes storing and erasing through programming. The storage layer 414 may store charges, and when the memory device is powered off, the charges can be stored in the storage layer 414. Blocking layer 412 is located between storage layer 414 and the gate layer for isolation. When the memory device is powered off, the charges in storage layer 414 are blocked from moving to the gate layer, thereby preventing data loss.

As shown in FIG. 4, second portion 406B of first semiconductor layer 406 and second portion 404B of second semiconductor layer 404 extend into the channel structure 460. In some implementations, second portion 406B of first semiconductor layer 406 and second portion 404B of second semiconductor layer 404 are surrounded by at least blocking layer 412, storage layer 414, and tunneling layer 416. In some implementations, first semiconductor layer 406 and semiconductor channel layer 418 are formed by a same material. In some implementations, first semiconductor layer 406 and semiconductor channel layer 418 are formed by polysilicon. In some implementations, first semiconductor layer 406 and core layer 422 are formed by a same material. In some implementations, first semiconductor layer 406 and core layer 422 are formed by polysilicon.

In some implementations, first semiconductor layer 406 is an undoped polysilicon layer, and second semiconductor layer 404 is an n+ doping polysilicon layer. For the purpose of having two semiconductor layers in which one is undoped and the other one is doped, the process of doping second semiconductor layer 404 could be accurately controlled. In some implementations, the process of forming second semiconductor layer 404, e.g., an n+ doping polysilicon layer, may include using the laser activation operation. In some implementations, first semiconductor layer 406 may be an undoped polysilicon layer. In some implementations, first semiconductor layer 406 may be a minor doped polysilicon layer. In some implementations, first semiconductor layer 406 may have a doping concentration less than $1\times10^{18}$ atom/cm$^3$, and second semiconductor layer 404 may have a doping concentration between $1\times10^{19}$ and $1\times10^{23}$ atom/cm$^3$. In some implementations, the semiconductor layer, including first semiconductor layer 406 and second semiconductor layer 404, is configured to generate gate-induced-drain-leakage (GIDL)-assisted body bias when performing the erase operation.

Figure 5:
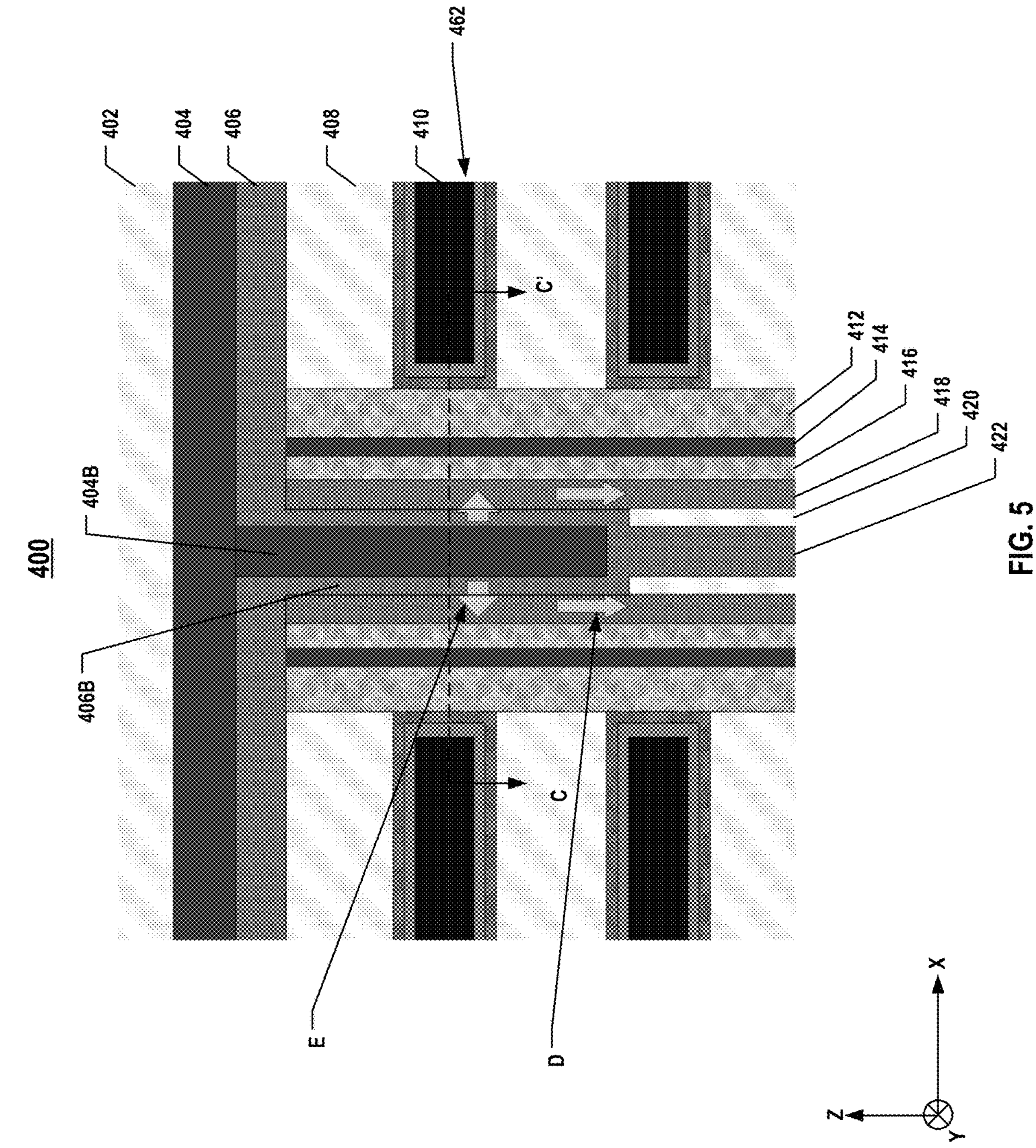
FIG. 5 illustrates a cross-sectional view of an exemplary memory device, according to some implementations of the present disclosure.

FIG. 5 illustrates an enlarged cross-sectional view of memory device 400, according to some implementations of the present disclosure. As shown in FIG. 5, in some implementations, second portion 406B of first semiconductor layer 406 and second portion 404B of second semiconductor layer 404 are overlapped with at least one layer of source select gate lines 462 in the X-direction along the line CC'. In some implementations, second portion 406B of first semiconductor layer 406, second portion 404B of second semiconductor layer 404, blocking layer 412, storage layer 414, tunneling layer 416, and semiconductor channel layer 418 together are overlapped with at least one layer of source select gate lines 462 in the X-direction along the line CC'. In other words, when memory device 400 is cut along the line CC', second portion 406B of first semiconductor layer 406, second portion 404B of second semiconductor layer 404, blocking layer 412, storage layer 414, tunneling layer 416, and semiconductor channel layer 418 are all overlapped with at least one layer of source select gate lines 462 in the X-direction.

During the erase operation, the injection direction of the BTBT current could include not only the vertical direction D but also the lateral direction E, as shown in FIG. 5, which could have more holes generated. In other words, by forming an undoped poly layer, e.g., first semiconductor layer 406, between the poly plug, e.g., second semiconductor layer 404, and the channel poly, e.g., semiconductor channel layer 418, the injection direction of the BTBT current in the erase operation could include not only the vertical direction D but also the lateral direction E that could have more holes generated. In addition, an activation operation, e.g., a laser activation operation, is performed to activate the n+ poly plug, e.g., second semiconductor layer 404, that could further prevent doping the undoped poly layer, e.g., first semiconductor layer 406. The erase efficiency of the 3D NAND memory device can be improved.

Figure 12:
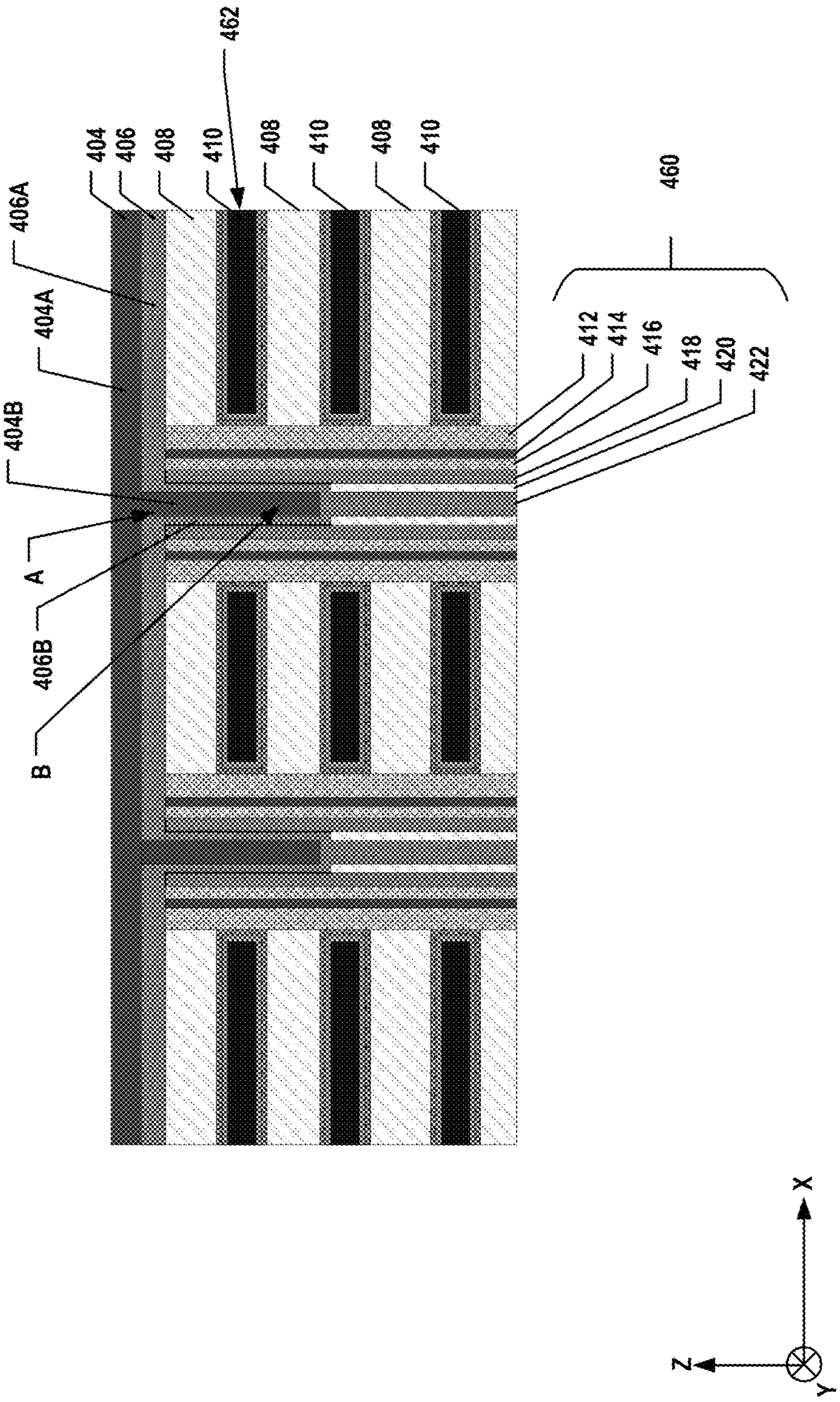
Figure 13:
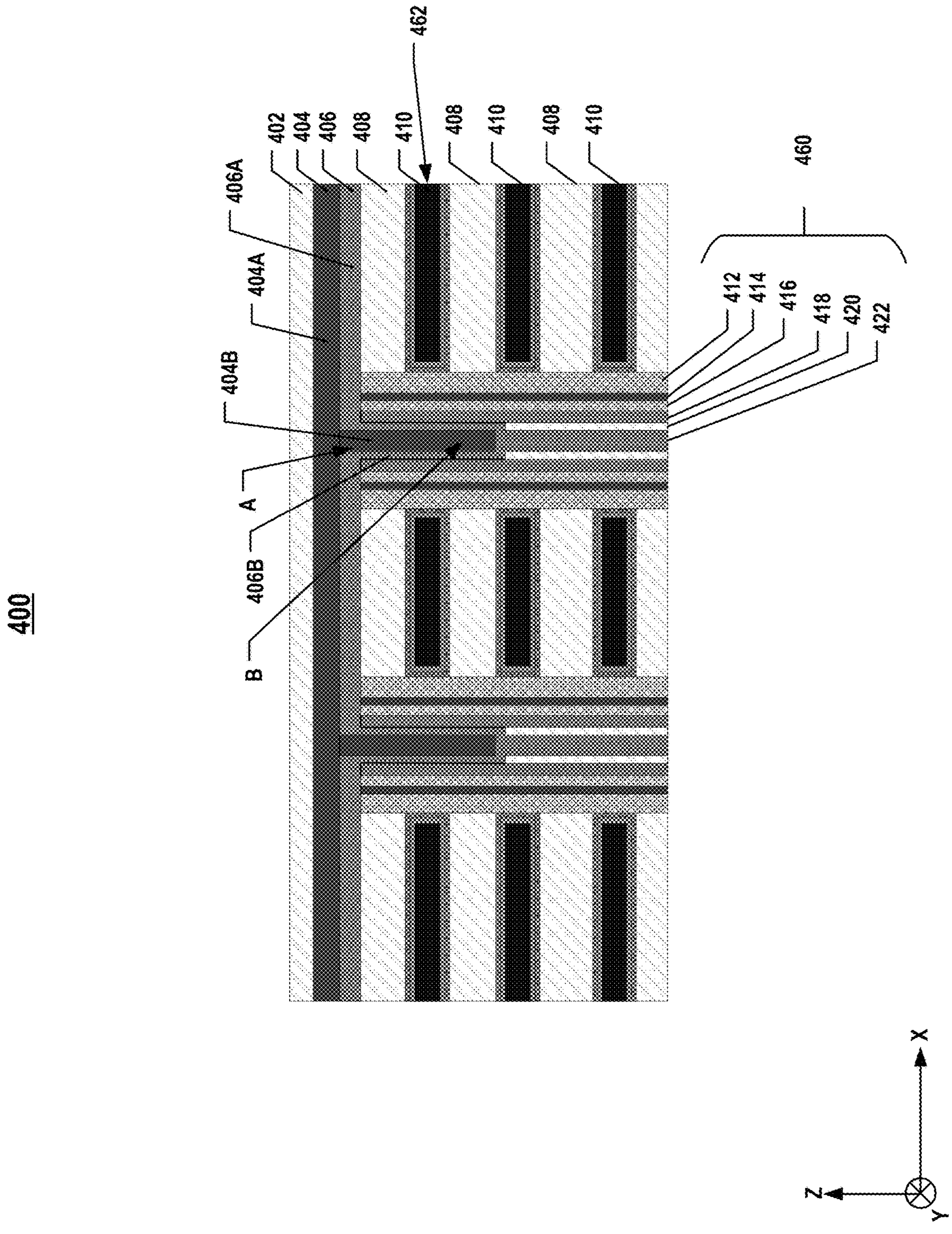
Figure 14:
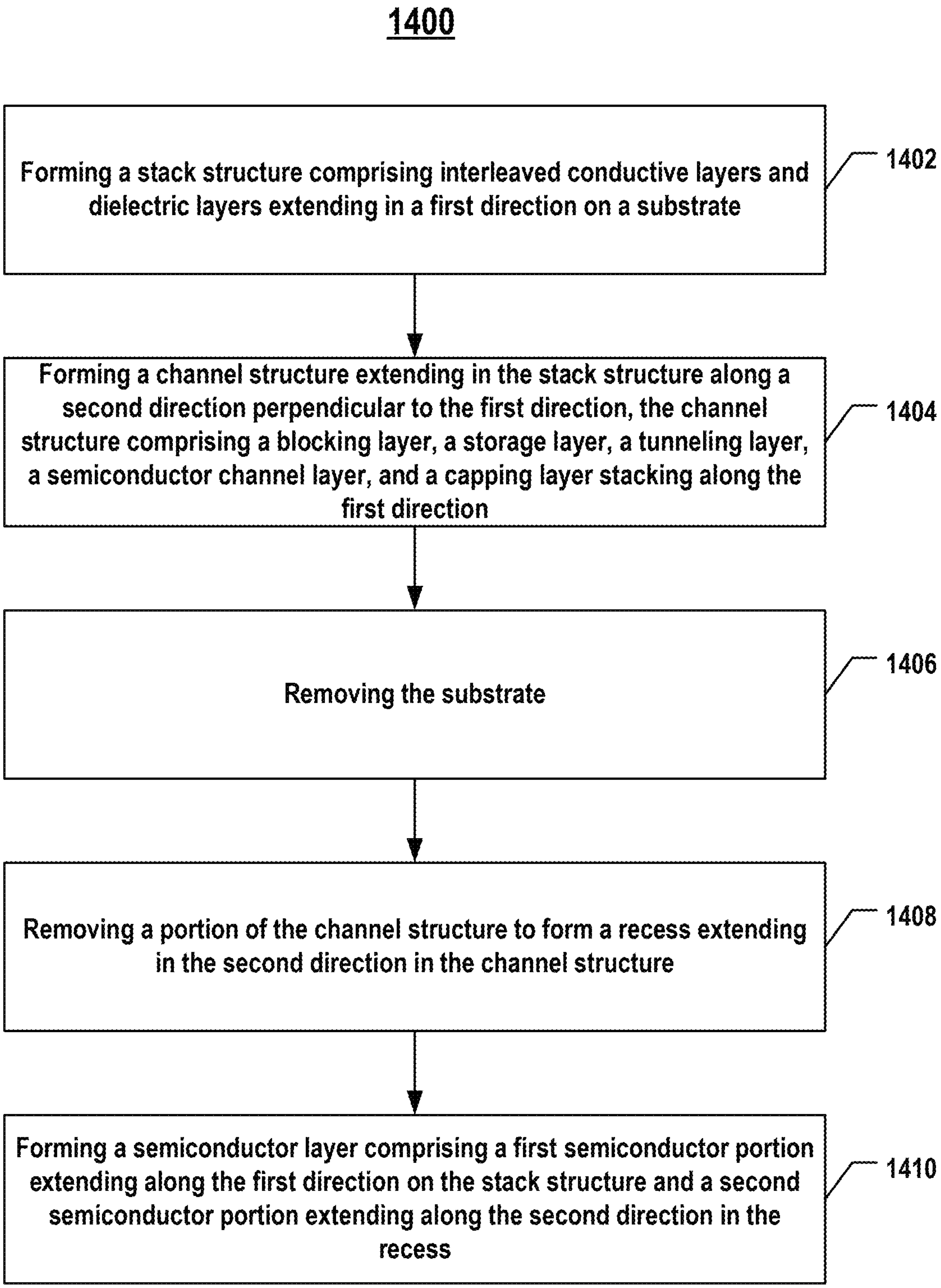
FIG. 14 illustrates a flowchart of a method for forming an exemplary memory device, according to some implementations of the present disclosure.

FIGS. 6-13 illustrate cross-sectional views of memory device 400 at various stages of a fabrication process, according to some implementations of the present disclosure. FIG. 14 illustrates a flowchart of a method 1400 for forming memory device 400, according to some implementations of the present disclosure. For the purpose of better describing the present disclosure, the cross-sections of memory device 400 in FIGS. 6-13 and method 1400 in FIG. 14 will be described together. It is understood that the operations shown in method 1400 are not exhaustive and that other operations may be performed as well before, after, or between any of the illustrated operations. Further, some of the operations may be performed simultaneously, or in a different order than shown in FIGS. 6-13 and FIG. 14.

Figure 6:
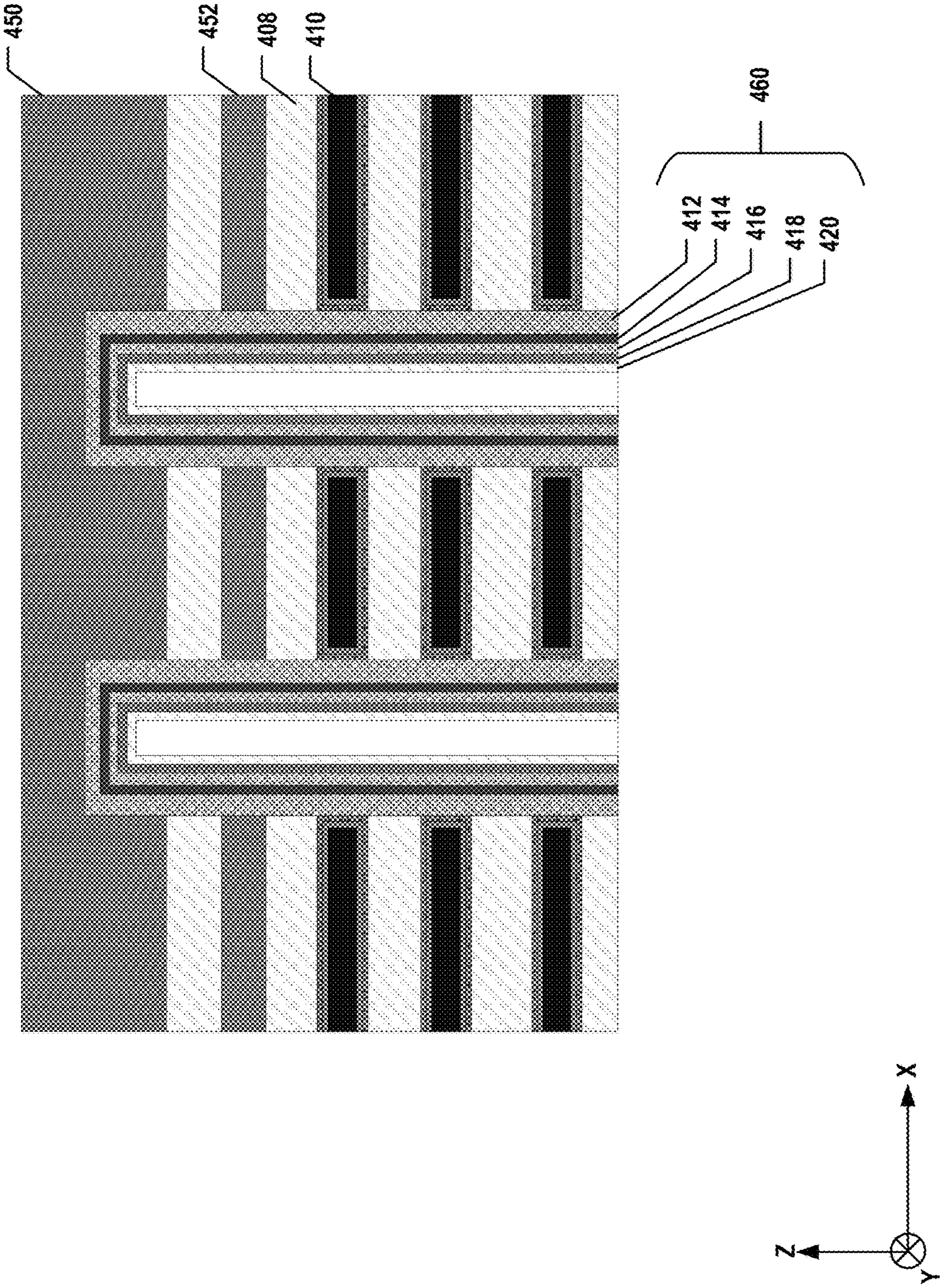
FIGS. 6-13 illustrate cross-sectional views of an exemplary memory device at various stages of a fabrication process, according to some implementations of the present disclosure.

As shown in FIG. 6 and operation 1402 in FIG. 14, a stack structure is formed. The stack structure includes interleaved conductive layers 410 and dielectric layers 408 extending in the X-direction on a substrate 450. In some implementations, a sacrificial layer 452 may be formed between the stack structure and substrate 450. The structure shown in FIG. 6 is a flipped structure after forming the stack structure on substrate 450. Therefore, substrate 450 is above the stack structure in FIG. 6. In some implementations, conductive layers 410 may be the word lines, and dielectric layer 408 may be the silicon oxide layers. In some implementations, conductive layer 410 may be a gate structure including a gate dielectric layer and a gate conductive layer on gate dielectric layer. In some implementations, the gate dielectric layer may include any suitable dielectric materials, such as silicon oxide, silicon nitride, silicon oxynitride, or high-k dielectrics. In some implementations, the gate dielectric layer includes silicon oxide, which is a form of a gate oxide. The gate conductive layer may include any suitable conductive materials, such as polysilicon, metals (e.g., W, Cu, Al, etc.), metal compounds (e.g., TiN, TaN, etc.), or silicides. In some implementations, the gate conductive layer may include doped polysilicon, which is a form of a gate poly.

As shown in FIG. 6 and operation 1404 in FIG. 14, channel structure 460 is formed in the stack structure extending along the Z-direction perpendicular to the X-direction. In some implementations, channel structure 460 includes blocking layer 412, storage layer 414, tunneling layer 416, semiconductor channel layer 418, and capping layer 420 stacking along the X-direction. In some implementations, the channel structure includes blocking layer 412, storage layer 414, tunneling layer 416, semiconductor channel layer 418, and capping layer 420 stacking along the radial direction of the channel structure. In some implementations, blocking layer 412, storage layer 414, and tunneling layer 416 are also named as a memory film. In some implementations, blocking layer 412 may include silicon oxide, silicon oxynitride, high-k dielectric material, or any combination thereof. In some implementations, storage layer 414 may include silicon nitride, silicon oxynitride, silicon, or any combination thereof. In some implementations, tunneling layer 416 may include silicon oxide, silicon oxynitride, or any combination thereof. In some implementations, the memory film may be a composite layer of silicon oxide/silicon nitride/silicon oxide (ONO).

Figure 7:
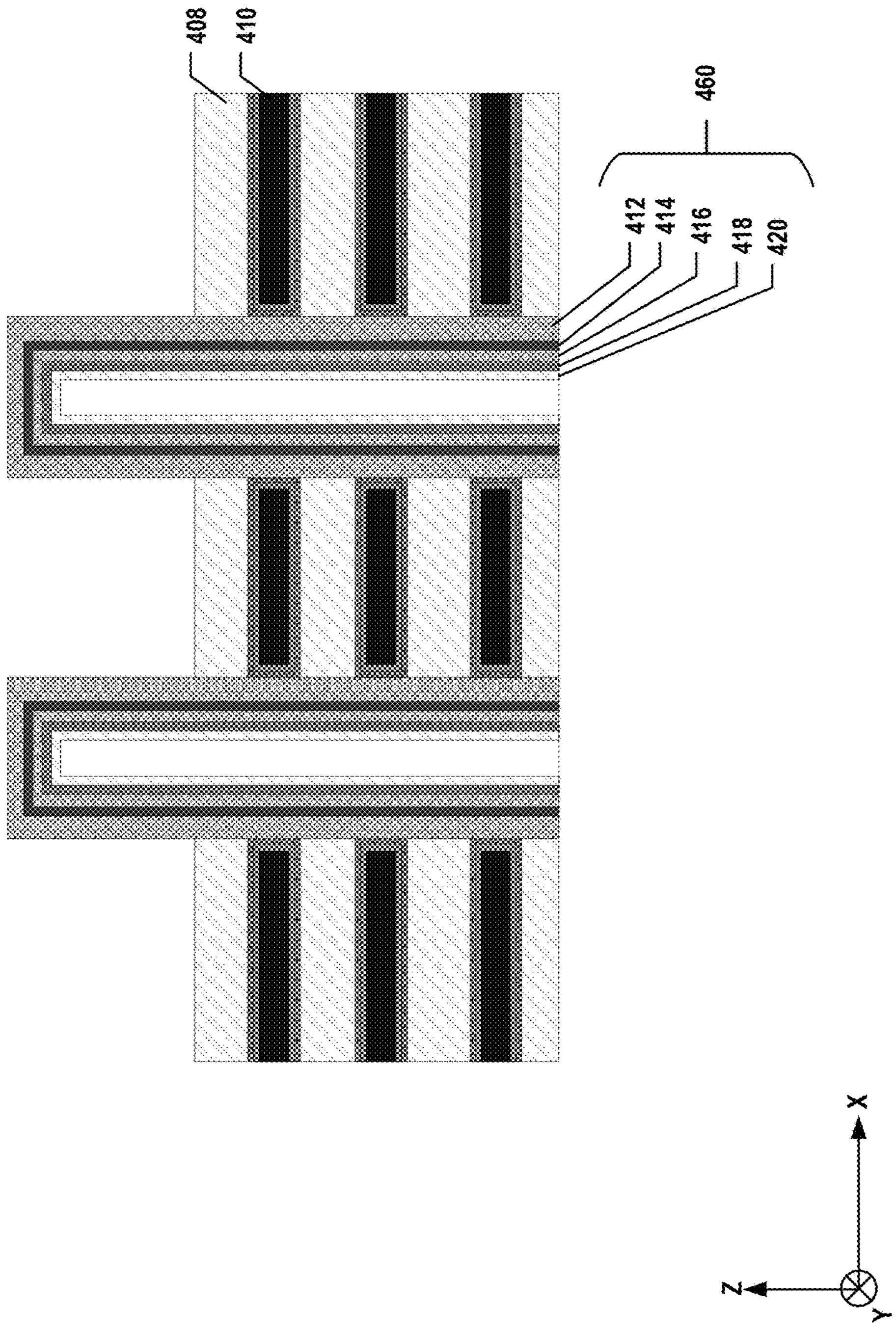

As shown in FIG. 7 and operation 1406 in FIG. 14, substrate 450 and sacrificial layer 452 are removed. In some implementations, substrate 450 and sacrificial layer 452 may be removed by using a wet etch process, a dry etch process, a chemical mechanical polishing (CMP) process, or any suitable removal process. As shown in FIG. 7, after removing substrate 450 and sacrificial layer 452, one end of channel structure 460, e.g., the top end, is exposed.

Figure 8:
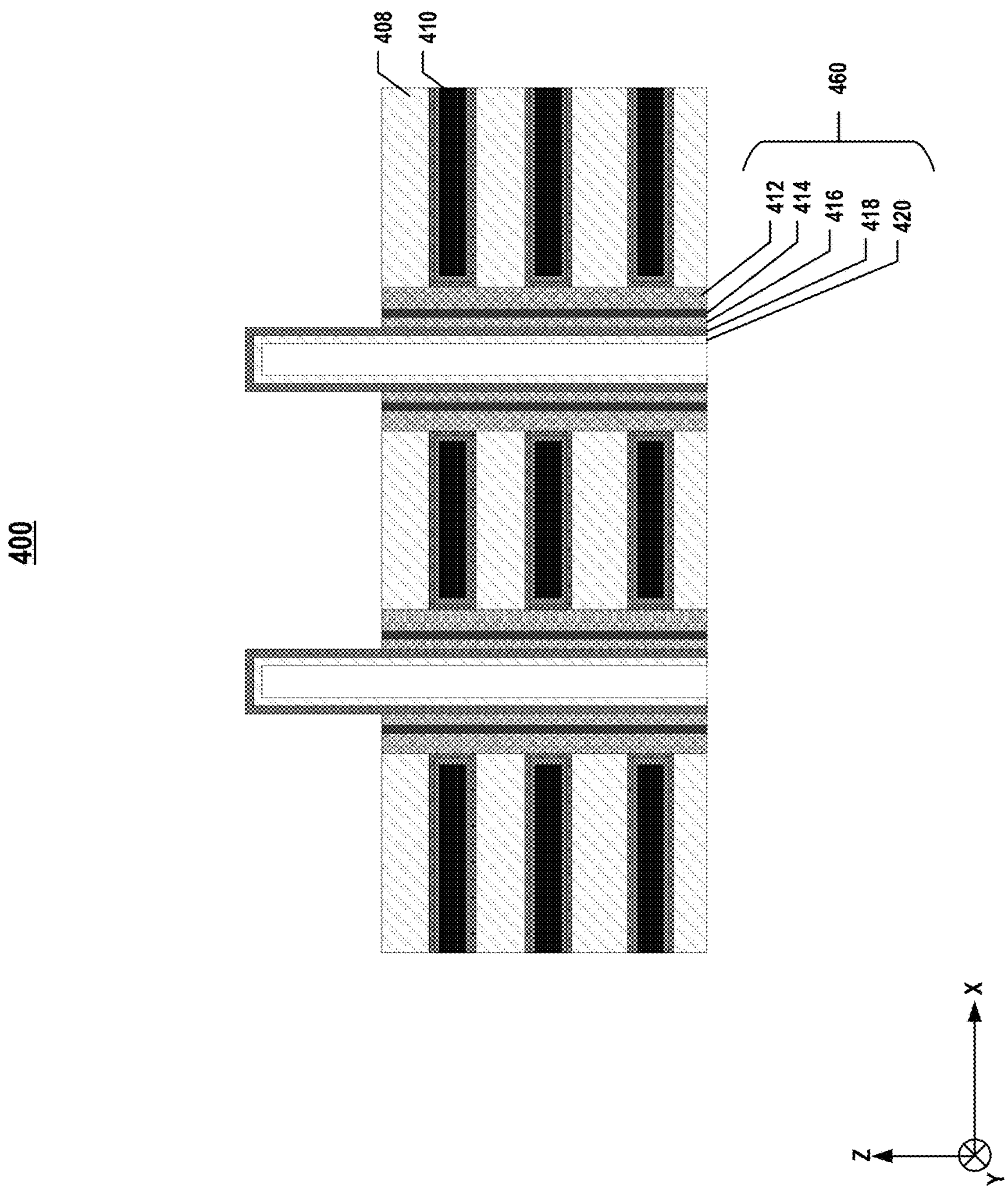
Figure 9:
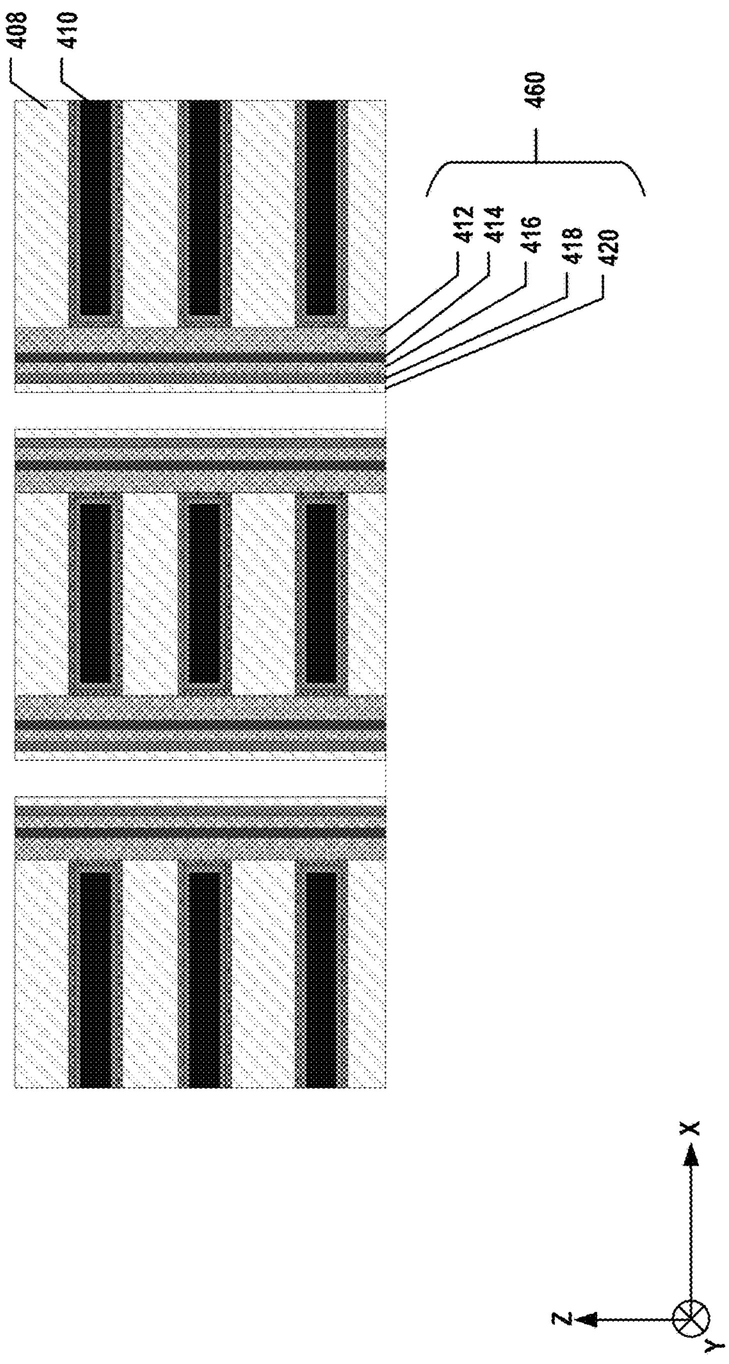
Figure 10:
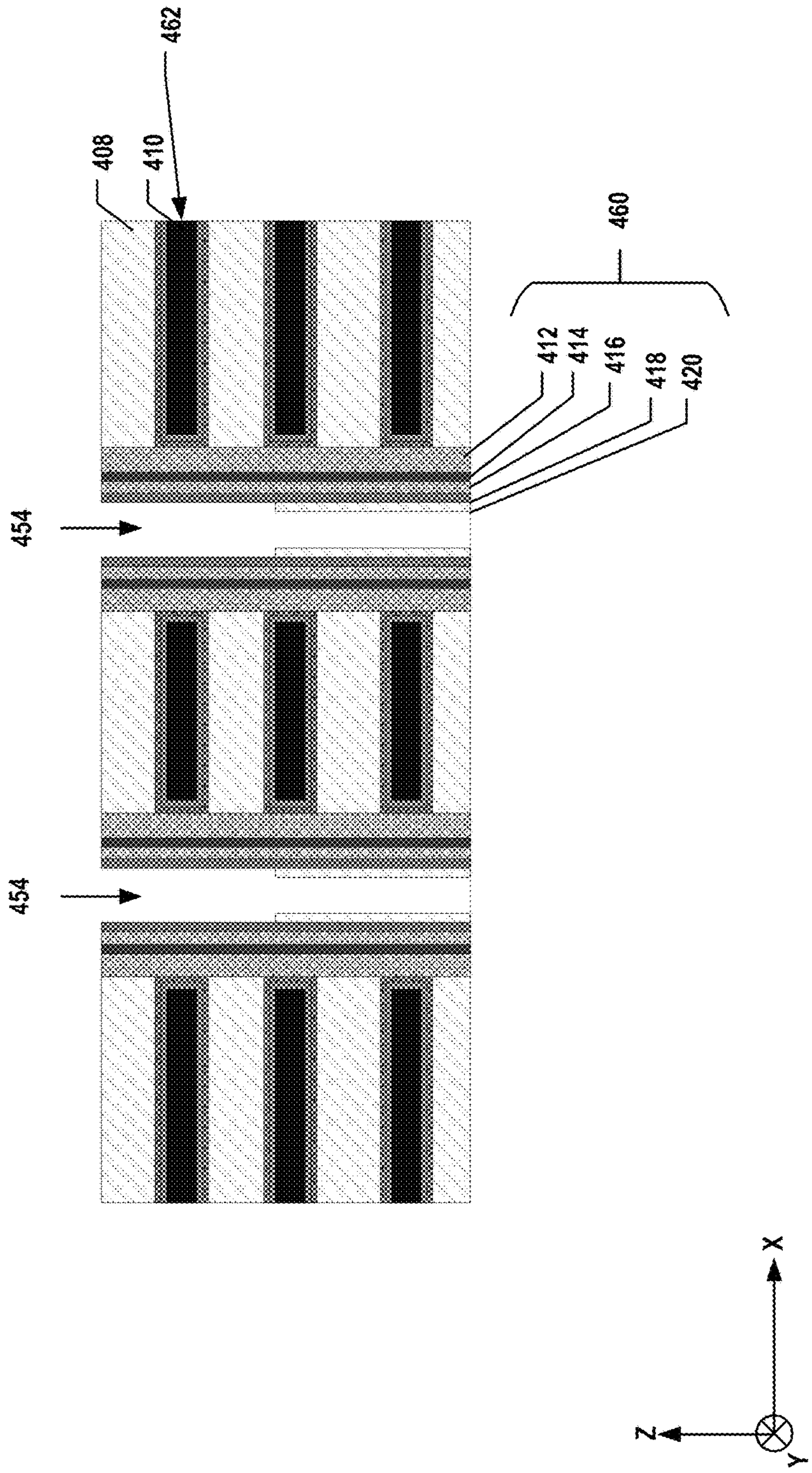

As shown in FIGS. 8-10 and operation 1408 in FIG. 14, a portion of channel structure 460 is removed to form a recess extending in the Z-direction in channel structure 460. As shown in FIG. 8, a portion of the memory film (the ONO layers), including blocking layer 412, storage layer 414, and tunneling layer 416, above the stack structure may be first removed. In some implementations, a portion of blocking layer 412, storage layer 414, and tunneling layer 416 may be removed by using a wet etch process, a dry etch process, or any suitable removal process.

Then, as shown in FIG. 9, semiconductor channel layer 418, and capping layer 420 above the stack structure are removed. In some implementations, semiconductor channel layer 418, and capping layer 420 above the stack structure may be removed by using the CMP process. As shown in FIG. 10, a portion of capping layer 420 is removed to form a recess 454 extending in the Z-direction. It is noted that, after forming recess 454, the top surface of capping layer 420 is lower than at least one layer of source select gate lines 462. In some implementations, after forming recess 454, the top surface of capping layer 420 is lower than multiple layers of source select gate lines 462.

Figure 11:
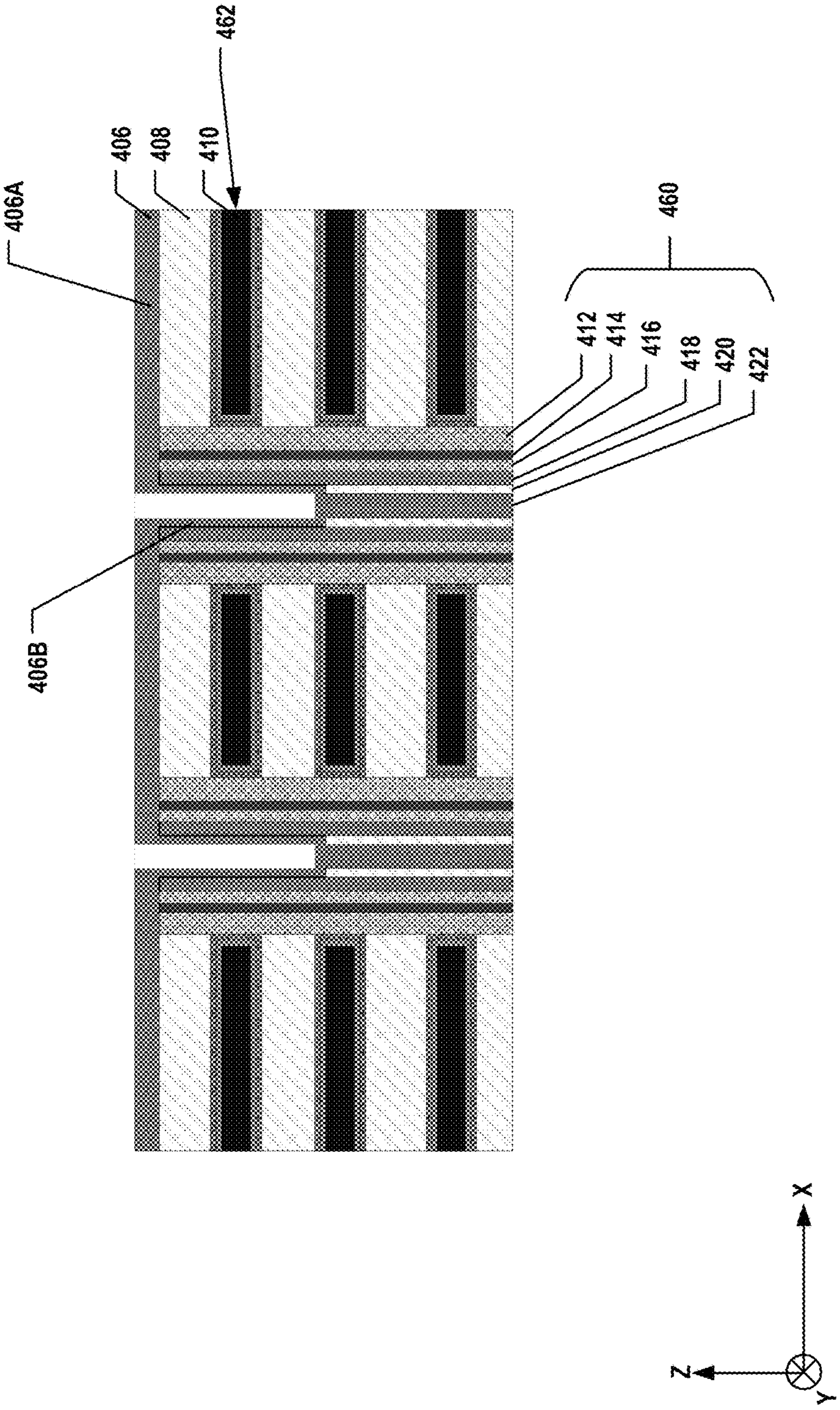

As shown in FIGS. 11-12 and operation 1410 in FIG. 14, first semiconductor layer 406 and second semiconductor layer 404 are formed on the stack structure. As shown in FIG. 11, first semiconductor layer 406 is first formed on the stack structure and in recess 454. In some implementations, first semiconductor layer 406 is formed in recess 454 in contact with semiconductor channel layer 418 and capping layer 420 and on a surface of the stack structure. In some implementations, first semiconductor layer 406 may also fill the gap in capping layer 420. By forming first semiconductor layer 406 in recess 454, a portion 406B of first semiconductor layer 406 extends into recess 454 along the Z-direction, and another portion 406A of first semiconductor layer 406 extends on the stack structure along the X-direction. In some implementations, first semiconductor layer 406 is an undoped polysilicon layer. Then, as shown in FIG. 12, second semiconductor layer 404 is formed on first semiconductor layer 406 and fills recess 454. By forming second semiconductor layer 404 in recess 454, a portion 404B of second semiconductor layer 404 extends into recess 454 along the Z-direction, and another portion 404A of second semiconductor layer 404 extends on the stack structure along the X-direction.

Then, a doping operation is performed on second semiconductor layer 404. In some implementations, an activation operation is performed on second semiconductor layer 404 to form the n+ doping polysilicon layer. The semiconductor layer includes a first semiconductor portion, including first portion 406A of first semiconductor layer 406 and first portion 404A of second semiconductor layer 404, extending along the X-direction. The semiconductor layer further includes a second semiconductor portion, including second portion 406B of first semiconductor layer 406 and second portion 404B of second semiconductor layer 404, extending along the Z-direction. In some implementations, second portion 404B of second semiconductor layer 404 has a first doping concentration at first end A of second portion 404B of second semiconductor layer 404 and a second doping concentration at second end B of second portion 404B of second semiconductor layer 404 opposite to the first end A in the Z-direction. In some implementations, a ratio of the first doping concentration at first end A and the second doping concentration at second end B is less than 20. In other words, the n+ doping concentration at first end A is less than 20 times of the n+ doping concentration at second end B. In some implementations, a ratio of the first doping concentration at first end A and the second doping concentration at second end B is less than 10. In other words, the n+ doping concentration at first end A is less than 10 times of the n+ doping concentration at second end B. In some implementations, a ratio of the first doping concentration at first end A and the second doping concentration at second end B is less than 5. In other words, the n+ doping concentration at first end A is less than 5 times of the n+ doping concentration at second end B.

In some implementations, the topmost layer, or the bottommost layer, of conductive layers 410 is formed as a source select gate line 462. In some implementations, multiple topmost layers, or multiple bottommost layers, of conductive layers 410 are formed as source select gate lines 462. It is noted that the number of layers of source select gate lines 462 is not limited in the present application. In the present application, the number of layers of source select gate lines 462 is at least greater than 1. As shown in FIG. 12, second portion 406B of first semiconductor layer 406 and second portion 404B of second semiconductor layer 404 are at least overlapped with one layer of source select gate lines 462 in the X-direction. As shown in FIG. 13, a cap dielectric layer, e.g., dielectric layer 402, is formed on second semiconductor layer 404. In some implementations, a pad-out layer (not shown) may be formed on the cap dielectric layer.

During the erase operation, the injection direction of the BTBT current could include not only the vertical direction D but also the lateral direction E, as shown in FIG. 5, which could have more holes generated. In other words, by forming an undoped poly layer, e.g., first semiconductor layer 406, between the poly plug, e.g., second semiconductor layer 404, and the channel poly, e.g., semiconductor channel layer 418, the injection direction of the BTBT current in the erase operation could include not only the vertical direction D but also the lateral direction E that could have more holes generated. In addition, an activation operation, e.g., a laser activation operation, is performed to activate the n+ poly plug, e.g., second semiconductor layer 404, that could further prevent doping the undoped poly layer, e.g., first semiconductor layer 406. The erase efficiency of the 3D NAND memory device can be improved.

Figure 15:
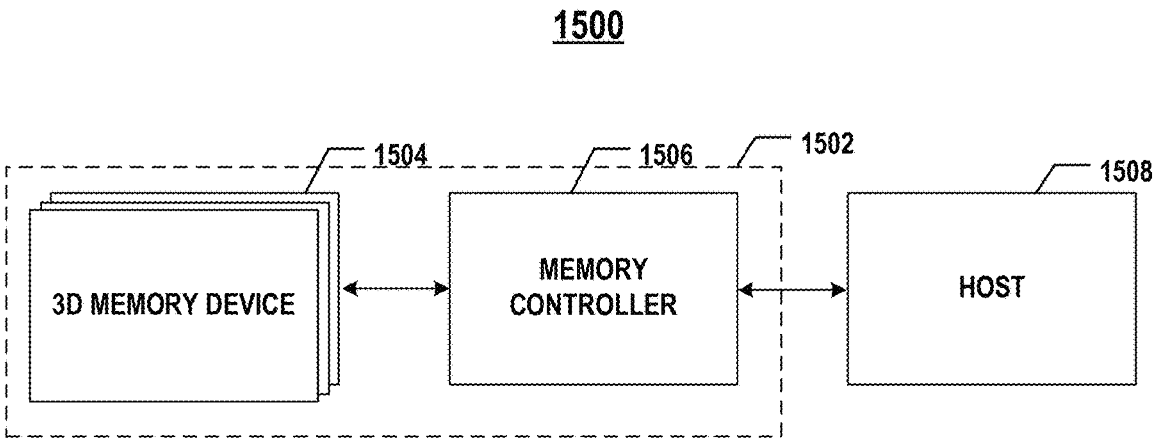
FIG. 15 illustrates a block diagram of an exemplary system having a memory device, according to some implementations of the present disclosure.

FIG. 15 illustrates a block diagram of a system 1500 having a memory device, according to some aspects of the present disclosure. System 1500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 15, system 1500 can include a host 1508 and a memory system 1502 having one or more memory devices 1504 and a memory controller 1506. Host 1508 can be a processor of an electronic device, such as a central processing unit (CPU), or a system-on-chip (SoC), such as an application processor (AP). Host 1508 can be configured to send or receive the data to or from memory devices 1504.

Memory device 1504 can be any memory devices disclosed herein, such as memory device 400. The transistors in the peripheral circuits of memory device 1504 may include a gate stack having a staircase shape, so that can enhance the control of the well region (the channel area) of the transistor to improve the body effect of the transistor. As a result, the operation speed of the transistors in the peripheral circuits of the 3D memory device can be further improved.

Memory controller 1506 is coupled to memory device 1504 and host 1508 and is configured to control memory device 1504, according to some implementations. Memory controller 1506 can manage the data stored in memory device 1504 and communicate with host 1508. In some implementations, memory controller 1506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1506 can be configured to control operations of memory device 1504, such as read, erase, and program operations. In some implementations, memory controller 1506 is configured to control the array of memory cells through the first peripheral circuit and the second peripheral circuit. Memory controller 1506 can also be configured to manage various functions with respect to the data stored or to be stored in memory device 1504 including, but not limited to bad-block management, garbage collection, logical-to-physical address conversion, wear leveling, etc. In some implementations, memory controller 1506 is further configured to process error correction codes (ECCs) with respect to the data read from or written to memory device 1504. Any other suitable functions may be performed by memory controller 1506 as well, for example, formatting memory device 1504. Memory controller 1506 can communicate with an external device (e.g., host 1508) according to a particular communication protocol. For example, memory controller 1506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 16A:
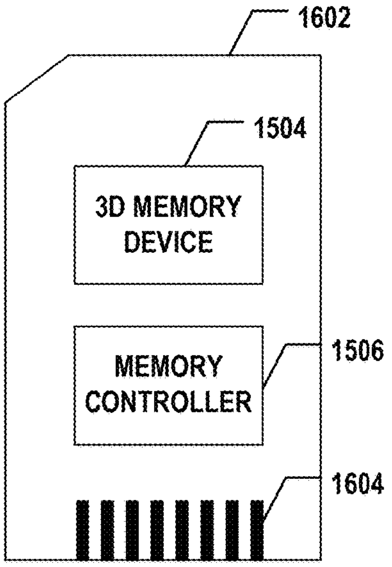
FIG. 16A illustrates a diagram of an exemplary memory card having a memory device, according to some implementations of the present disclosure.
Figure 16B:
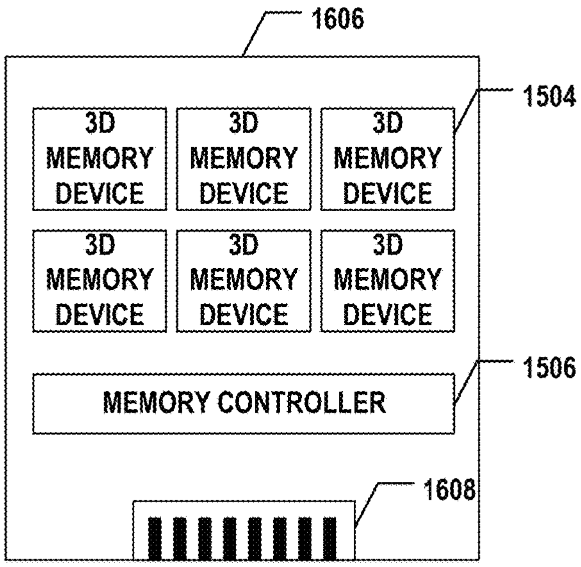
FIG. 16B illustrates a diagram of an exemplary solid-state drive (SSD) having a memory device, according to some implementations of the present disclosure.

Memory controller 1506 and one or more memory devices 1504 can be integrated into various types of storage devices, for example, be included in the same package, such as a universal Flash storage (UFS) package or an eMMC package. That is, memory system 1502 can be implemented and packaged into different types of end electronic products. In one example as shown in FIG. 16A, memory controller 1506 and a single memory device 1504 may be integrated into a memory card 1602. Memory card 1602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1602 can further include a memory card connector 1604 coupling memory card 1602 with a host (e.g., host 1508 in FIG. 15). In another example as shown in FIG. 16B, memory controller 1506 and multiple memory devices 1504 may be integrated into an SSD 1606. SSD 1606 can further include an SSD connector 1608 coupling SSD 1606 with a host (e.g., host 1508 in FIG. 15). In some implementations, the storage capacity and/or the operation speed of SSD 1606 is greater than those of memory card 1602.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:

a stack structure comprising interleaved conductive layers and dielectric layers extending in a first direction;

a semiconductor layer comprising a first semiconductor layer in contact with the stack structure and a second semiconductor layer on the first semiconductor layer; and a channel structure extending in the stack structure along a second direction perpendicular to the first direction, and in contact with the first semiconductor layer, wherein the semiconductor layer comprises a first semiconductor portion extending along the first direction and a second semiconductor portion extending into the channel structure along the second direction.

2. The memory device of claim 1, wherein the conductive layers comprise at least one source select gate line, and the second semiconductor portion overlaps the at least one source select gate line in the first direction.

3. The memory device of claim 2, wherein the channel structure comprises a blocking layer, a storage layer, a tunneling layer, a semiconductor channel layer, and a capping layer stacking along the first direction, and the second semiconductor portion is surrounded by at least the blocking layer, the storage layer, and the tunneling layer.

4. The memory device of claim 3, wherein the first semiconductor layer is in contact with the semiconductor channel layer and the capping layer.

5. The memory device of claim 3, wherein the channel structure further comprises a core layer filled in the capping layer, and the first semiconductor layer and the core layer comprise a same material and are formed in a same process.

6. The memory device of claim 3, wherein the second semiconductor portion, the blocking layer, the storage layer, the tunneling layer, and the at least one source select gate line overlap in the first direction.

7. The memory device of claim 1, wherein the second semiconductor layer has a first doping concentration at a first end of the second semiconductor portion and a second doping concentration at a second end of the second semiconductor portion opposite to the first end in the second direction, and a ratio of the first doping concentration and the second doping concentration is less than 10.

8. The memory device of claim 7, wherein the first semiconductor layer has a doping concentration less than $1\times10^{18}$ atom/cm$^3$, and the second semiconductor layer has a doping concentration between $1\times10^{19}$ and $1\times10^{23}$ atom/cm$^3$.

9. The memory device of claim 1, wherein the semiconductor layer is configured to generate gate-induced-drain-leakage (GIDL)-assisted body bias when performing an erase operation.

10. A method of manufacturing a semiconductor device, comprising:

forming a stack structure comprising interleaved conductive layers and dielectric layers extending in a first direction on a substrate;

forming a channel structure extending in the stack structure along a second direction perpendicular to the first direction, the channel structure comprising a blocking layer, a storage layer, a tunneling layer, a semiconductor channel layer, and a capping layer stacking along the first direction;

removing the substrate;

removing a portion of the channel structure to form a recess extending in the second direction in the channel structure; and forming a semiconductor layer comprising a first semiconductor portion extending along the first direction on the stack structure and a second semiconductor portion extending along the second direction in the recess, wherein a first end of the second semiconductor portion has a first doping concentration and a second end of the second semiconductor portion opposite to the first end in the second direction has a second doping concentration, and a ratio of the first doping concentration and the second doping concentration is less than 10.

11. The method of claim 10, wherein removing the portion of the channel structure to form the recess extending in the second direction in the channel structure, comprises:

removing the blocking layer, the storage layer, and the tunneling layer;

removing the semiconductor channel layer and the capping layer, wherein the channel structure is coplanar with the stack structure; and removing a portion of the capping layer to form the recess extending in the second direction in the channel structure.

12. The method of claim 10, wherein forming the semiconductor layer, comprises:

forming a first semiconductor layer in the recess in contact with the semiconductor channel layer and the capping layer and on a surface of the stack structure; and forming a second semiconductor layer on the first semiconductor layer.

13. The method of claim 12, wherein the first semiconductor layer and the second semiconductor layer have different doping concentrations, and a doping concentration of the second semiconductor layer is higher than a doping concentration of the first semiconductor layer.

14. The method of claim 12, further comprising:

performing an activation operation on the second semiconductor layer.

15. The method of claim 12, further comprising:

forming a core layer filled in the capping layer, wherein the first semiconductor layer and the core layer comprise a same material and are formed in a same process.

16. The method of claim 12, further comprising:

forming a cap dielectric layer on the second semiconductor layer; and forming a pad-out layer on the cap dielectric layer.

17. The method of claim 10, wherein forming the semiconductor layer in the recess, comprises:

forming the semiconductor layer in the recess surrounded by the blocking layer, the storage layer, and the tunneling layer.

18. The method of claim 10, wherein the stack structure comprises at least one source select gate line extending in the first direction, and forming the semiconductor layer in the recess, comprises:

forming the semiconductor layer in the recess overlapping the at least one source select gate line in the first direction.

19. The method of claim 10, wherein removing the substrate, comprises:

removing the substrate from the stack structure; and removing a sacrificial layer of the stack structure.

20. A system, comprising:

a memory device, comprising:

a stack structure comprising interleaved conductive layers and dielectric layers extending in a first direction;

a semiconductor layer comprising a first semiconductor layer in contact with the stack structure and a second semiconductor layer on the first semiconductor layer; and a channel structure extending in the stack structure along a second direction perpendicular to the first direction, and in contact with the first semiconductor layer, wherein the semiconductor layer comprises a first semiconductor portion extending along the first direction and a second semiconductor portion extending into the channel structure along the second direction; and a memory controller coupled to the memory device and configured to control operations of the channel structure.

* * * * *